United States Patent
Lee et al.

(10) Patent No.: US 9,746,767 B2
(45) Date of Patent: Aug. 29, 2017

(54) PHOTORESIST COMPOSITION AND METHOD OF MANUFACTURING BLACK MATRIX USING THE SAME

(71) Applicant: Samsung Display Co., Ltd., Yongin-si (KR)

(72) Inventors: Ki Beom Lee, Seoul (KR); Hyun-Seok Kim, Hwaseong-si (KR); Hi Kuk Lee, Yongin-si (KR); Jae Hyuk Chang, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 30 days.

(21) Appl. No.: 14/881,815

(22) Filed: Oct. 13, 2015

(65) Prior Publication Data
US 2016/0195806 A1    Jul. 7, 2016

(30) Foreign Application Priority Data
Jan. 7, 2015  (KR) .................. 10-2015-0002205

(51) Int. Cl.
| | |
|---|---|
| *G03F 7/031* | (2006.01) |
| *G03F 7/00* | (2006.01) |
| *G03F 7/20* | (2006.01) |
| *G03F 7/32* | (2006.01) |

(52) U.S. Cl.
CPC ............ *G03F 7/0007* (2013.01); *G03F 7/031* (2013.01); *G03F 7/20* (2013.01); *G03F 7/325* (2013.01)

(58) Field of Classification Search
CPC ........ G03F 7/0007; G03F 7/20; G03F 7/2002; G03F 7/031; G03F 7/028; G03F 7/032; G02B 5/201; G02B 5/223; G02F 1/133512

USPC .................. 430/7, 270.1, 281.1; 349/110
See application file for complete search history.

(56) References Cited

U.S. PATENT DOCUMENTS

| | | | |
|---|---|---|---|
| 8,262,946 B2 | 9/2012 | Shimizu et al. | |
| 8,980,528 B2 | 3/2015 | Lee et al. | |
| 2011/0151379 A1 | 6/2011 | Choi et al. | |
| 2011/0294049 A1* | 12/2011 | Makino | C08F 2/50 430/7 |
| 2012/0035292 A1 | 2/2012 | Onclin et al. | |
| 2013/0302727 A1* | 11/2013 | Lee | G03F 7/0007 430/7 |
| 2013/0306919 A1* | 11/2013 | Maruyama | G03F 7/0007 252/586 |

(Continued)

FOREIGN PATENT DOCUMENTS

| | | |
|---|---|---|
| JP | 2010-266740 | 11/2010 |
| KR | 10-2011-0071965 | 6/2011 |

(Continued)

OTHER PUBLICATIONS

Computer-generated translation of KR 2013-0053908 (May 2013).*

*Primary Examiner* — John A McPherson
(74) *Attorney, Agent, or Firm* — H.C. Park & Associates, PLC

(57) ABSTRACT

A photoresist composition including 5 wt % to 10 wt % of a binder resin, 5 wt % to 10 wt % of a photopolymerization monomer, 1 wt % to 5 wt % of a photopolymerization initiator comprising an oxime ester-based compound and activated by light in a wavelength range of 400 nm to 410 nm, 5 wt % to 10 wt % of a black coloring agent, and a residual amount of a solvent.

18 Claims, 7 Drawing Sheets

(56) References Cited

U.S. PATENT DOCUMENTS

2014/0045121 A1* 2/2014 Lee .................... G03F 7/033
430/280.1
2014/0085578 A1 3/2014 Gu et al.

FOREIGN PATENT DOCUMENTS

KR 2013-0053908 A * 5/2013
KR 10-2014-0020536 2/2014

* cited by examiner

PHOTORESIST COMPOSITION AND METHOD OF MANUFACTURING BLACK MATRIX USING THE SAME

CROSS-REFERENCE TO RELATED APPLICATION

This application claims priority from and the benefit of Korean Patent Application No. 10-2015-0002205, filed on Jan. 7, 2015, which is hereby incorporated by reference for all purposes as if fully set forth herein.

BACKGROUND

Field

Exemplary embodiments relate to a photoresist composition, and a method of manufacturing a black matrix using the same.

Discussion of the Background

Generally, a photoresist pattern is formed by coating a photoresist composition on a base substrate to form a coating film, and then exposing and developing the coating film. A mask to determine the shape of a photoresist pattern is used in a process of exposing the coating film. A black matrix of an etching process may be formed using the photoresist pattern, a mask, an insulating layer, and a color filter.

As image quality of displays requires higher resolution, there is an increased need for improving light transmittance by reducing the line width of a pattern region of a black matrix.

To date, various methods have been attempted in forming a fine pattern of a black matrix. As the line width of a mask is decreased, light intensity irradiated in an exposure process is decreased, resulting in the irradiated light not reaching a lower part of a photoresist film. Thus, the photoresist may not be sufficiently cured. Accordingly, a lower side of a photoresist is unduly developed thereby forming an undercut which is partially removed from a lower side, and a final formed pattern of a black matrix becomes a trapezoid shape as opposed to a rectangular shape. In other words, a reverse taper angle is generated in the development process.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a photoresist composition having the advantage of forming a fine pattern to a black matrix to implement higher resolution in image quality, and a method of manufacturing a black matrix using the same.

Additional aspects will be set forth in the detailed description which follows, and, in part, will be apparent from the disclosure, or may be learned by practice of the inventive concept.

An exemplary embodiment discloses a photoresist composition. The photoresist composition includes 5 wt % to 10 wt % of a binder resin, 5 wt % to 10 wt % of a photopolymerization monomer, 1 wt % to 5 wt % of a photopolymerization initiator activated by light in a wavelength range of 400 nm to 410 nm, 5 wt % to 10 wt % of a black coloring agent, and a residual amount of a solvent. The photopolymerization initiator also includes an oxime ester-based compound.

An exemplary embodiment discloses a method of manufacturing a black matrix. The method includes applying a photoresist composition including 5 wt % to 10 wt % of a binder resin, 5 wt % to 10 wt % of a photopolymerization monomer, 1 wt % to 5 wt % of a photopolymerization initiator activated by light in a range of a wave length of 400 nm to 410 nm, 5 wt % to 10 wt % of a black coloring agent, 1 wt % or less of an additive, and a residual amount of a solvent, on a base substrate to form a coating film, wherein the photopolymerization initiator includes an oxime ester-based compound. The method also includes exposing the coating film to form a photopolymer and developing the coating film on which the photopolymer is formed to form a photoresist pattern.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
FIG. 1, FIG. 2, FIG. 3, FIG. 4, and FIG. 5 are cross-sectional views for describing a method of manufacturing a black matrix and a display substrate according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

A photoresist composition according to an exemplary embodiment will be first described, followed by a method of manufacturing a black matrix using the photoresist composition.

Photoresist Composition

A photoresist composition according to an exemplary embodiment includes a binder resin, a photopolymerization monomer, a photopolymerization initiator, a black coloring agent, and solvent. The photoresist composition may further include at least one of a dispersant, a sensitizer, a wavelength shifter, and an additive.

Each component of the photoresist composition will be described in detail.

A. Binder Resin

A binder resin, which is a base resin of the photoresist composition according to an exemplary embodiment, reacts with light in an exposure process to form a photoresist layer. In an embodiment, the binder resin may be suitable for use by introducing various monomers. The binder resin may include an acryl-based resin capable of controlling flowability of a black matrix pattern and/or a cardo-based binder resin capable of excellently controlling the development of patterns by adjusting an acid value.

The binder resin according to an exemplary embodiment may include an acryl-based resin, and preferably further include a cardo-based resin. The binder resin may be solubilized in an alkaline developing solution.

In the present embodiment, the photoresist composition may include an acryl-based resin with an average molecular weight of about 3,000 to about 50,000 so that it may provide a stable coast on the resin and also have a suitable density.

The acryl-based resin may be obtained from polymerization of acrylate monomers. For example, the acryl-base resin may include monomers such as methacrylic acid, acrylic acid, crotonic acid, maleic acid, vinyl pyrrolidone, styrene, methyl methacrylate, benzyl methacrylate, 2-hydroxyethyl methacrylate, aryl methacrylate, glycidyl methacrylate or the like. Each of these listed compounds may be used alone or in combination with another listed or unlisted compound. Thus, the acryl-based resin may be a copolymer obtained from two or more monomers.

2,2'-azobis(2,4-dimethyl)valeronitrile may be used as a thermal initiator for synthesizing the binder resin in the exemplary embodiment. The thermal initiator may make up about 5 wt % to about 20 wt % of the total weight of the acryl-based resin composition.

Furthermore, a polymerization inhibitor, such as 4-hydroxybenzophenone, may be used to control the molecular weight of acryl-based resin through a polymerization reaction. The polymerization inhibitor may make up about 1 wt % or less of the total weight of the acryl-based resin composition.

The molecular weight of the cardo-based resin is preferably lower than that of the acryl-based resin. For example, the weight average molecular weight of the cardo-based resin may be about 3,000 to about 10,000.

The cardo-based resin may be also obtained by polymerization of monomers. For example, the cardo-based resin may include monomers such as 9,9-bis(4-hydroxyphenyl) fluorene, epichlorohydrin, acrylic acid, and the like. These monomers may be used alone or in combination. Therefore, the cardo-based resin may be a copolymer obtained from two or more monomers.

A digital exposure apparatus used in photocuring of the photoresist composition may use a light source different from that of the existing exposure apparatus. When the photoresist composition includes only an acryl-based resin, the taper angle of photoresist patterns may be unduly increased or the adhesion strength of photoresist patterns may be reduced. When the taper angle of photoresist patterns is unduly increased, the shading ability may be deteriorated resulting in an unsuitable black matrix. The photoresist composition according to the present exemplary embodiment includes a cardo-based resin in addition to an acryl-based resin. The addition of the cardo-based resin increases the adhesion strength of photoresist patterns and forms photoresist patterns having an appropriate taper angle.

Preferably, the amount of acryl-based resin is higher than the cardo-based resin. For example, the weight ratio between the cardo-based resin and the acryl-based resin may be about 9:2 to about 8:2.

Preferably, the binder resin is about 5 wt % to about 10 wt % of the total weight of the photoresist composition. If the content of the binder resin is less than about 5 wt % of the total weight of the photoresist composition, the coating film formed from the photoresist composition may have low dimensional stability. On the contrary, if the binder resin is more than about 10 wt % of the photoresist composition, the photoresist composition may have increased viscosity and deteriorated dispersibility in a solvent. A photoresist composition with an increased viscosity and deteriorated dispersibility in a solvent may result in a coating film having a non-uniform thickness increasing the difficulty in forming fine or intricate patterns.

B. Photopolymerization Monomer

A photoresist layer is formed through a polymerization reaction of a photopolymerization monomer. The polymerization reaction is initiated by a radical formed from a photopolymerization initiator through light irradiation in an exposure process. In the polymerization reaction, a photopolymerization monomer may be bonded via a crosslinked bond to another photopolymerization monomer or a binder resin.

In an embodiment, the photopolymerization monomer may include an acrylate group. Depending on the number of acrylate groups, the photopolymerization monomer may include a polyfunctional monomer and monofunctional monomer. The photopolymerization monomer with a polyfunctional monomer and a monofunctional monomer may control a photocuring rate and promote a thermal reaction.

Examples of the polyfunctional monomer includes dipentaerythritol hexaacrylate, pentaerythritol triacrylate, pentaerythritol tetraacrylate, trimethylpropane triacrylate, trimethylpropane trimethacrylate, glycerol triacrylate, tris(2-hydroxyethyl)isocyanurate triacrylate, di-trimethylpropane tetraacrylate, dipentaerythritol pentaacrylate, pentaerythritol tetraacrylate, or the like. These exemplary polyfunctional monomers may be used alone or in combination of two or more.

Examples of the monofunctional monomer includes glycidyl methacrylate, hydroxyethyl methacrylate, 2-hydroxy-3-phenoxypropyl acrylate, diethyleneglycol methylether methacrylate, hydroxyethyl acrylate, butyl methacrylate, hydroxypropyl acrylate, 2-phenoxyethyl acrylate, 2-pheonoxyethyl methacrylate, 3,3,5-trimethylcyclohexyl methacrylate, isobornyl acrylate, isobornyl methacrylate, isodecyl acrylate, isodecyl methacrylate, isooctyl acrylate, lauryl acrylate, stearyl acrylate, tetrahydrofurfuryl acrylate, tridecyl acrylate, or the like. These exemplary monofunctional monomers may be used alone or in combination of two or more.

Preferably, the amount of monofunctional monomer is higher than the amount of the polyfunctional monomer. For example, a weight ratio between the polyfunctional monomer and the monofunctional monomer may be about 1:9 to about 3:7.

Preferably, the photopolymerization monomer is about 5 wt % to about 10 wt % of the total weight of the photoresist composition. If the amount of the photopolymerization monomer is less than about 5 wt % of the total weight of the photoresist composition, then bonding strength of the binder resin is lowered, thereby lowering the dimensional stability of photoresist patterns. Furthermore, if the amount of the photopolymerization monomer is more than about 10 wt % of the total weight of the photoresist composition, then fine or intricate patterns may be difficult to form.

C. Photopolymerization Initiator

A photopolymerization initiator includes a compound activated by light of an h-line wavelength range. In other words, in a wavelength range of about 400 nm to about 410 nm. Preferably, the photopolymerization initiator is the compound sensing an h-line wavelength range, while blocking visible light. The photoresist composition may be photocured because the photopolymerization initiator generates radicals by light.

A digital exposure apparatus photocures the photoresist composition using a light source providing light at h-line wavelength (e.g., about 405 nm). The photopolymerization initiator has a high absorbance to the light provided by the light source (e.g., at about 405 nm). Therefore, the photoresist composition may be suitable to form a photoresist pattern using the digital exposure apparatus.

In an embodiment, the photopolymerization initiator may be a strong initiator capable of forming fine patterns of 4 µm. The strong initiator may be an oxime ester-based compound represented by following Chemical Formula 1:

[Chemical Formula 1]

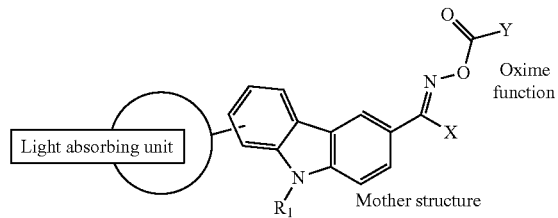

wherein X, Y and $R_1$ are, independently of one another, selected from the group consisting of hydrogen, halogen, (C1-C20)alkyl, (C6-C20)aryl, (C1-C20)alkoxy, (C6-C20)aryl(C1-C20)alkyl, hydroxy(C1-C20)alkyl, hydroxy (C1-C20)alkoxy(C1-C20)alkyl, (C3-C20)cycloalkyl, and the like, but not limited thereto.

Specifically, the strong initiator is an initiator capable of sensing an h-line by modifying a light absorption region (light absorbing unit) in above Chemical Formula 1. A photoresist composition including the oxime ester-based compound allows fine patterning and improves adhesion.

More specifically, the oxime ester-based compound may be exemplified as [1-(4-phenylsufanylbenzoyl)hepthylideneamino]bezonate), [1-[9-ethyl-6-(2-methylbenzoyl)carbazol-3-yl]ethylideneamino]acetate, and the like. These may be used alone or in combination.

In an embodiment, the photopolymerization initiator may further include, as a surficial-portion initiator, a bisacylphosphine-based compound, an onoacylphosphine-based compound, a metallocene-based compound, an alpha-hydroxyketone-based compound, or the like. These may be used alone, respectively, or in combination of two or more.

In an embodiment, the photopolymerization initiator may include phenylbis(2,4,6-trimethylbenzoyl)phosphine oxide (Irgacure 819, Ciba, Switzerland), diphenyl(2,4,6-trimethylbenzoyl)phosphine oxide (Darocur TPO, Ciba, Switzerland), phenyl bis(2,4,6-trimethylbenzoyl)phosphine oxide (Irgacure 2100, Ciba, Switzerland), or bis(eta5-2,4-cyclopentadien-1-yl)bis[2,6-difluoro-3-(1H-pyrrol-1-yl)phenyl] titanium (Irgacure 784, Ciba, Switzerland), 4-(dimethylamino)benzophenone, or the like may be included. These may be used alone, respectively, or in combination of two or more.

The photopolymerization initiator may further include a deep-portion initiator. Generally, a surface part of a coating film on which light is directly incident in an exposure process is cured well, but a lower portion of the coating film may not be sufficiently cured, and thus, skew may be increased, and the coating film may be lifted off.

Preferably, the photoresist composition may further include a deep-portion initiator, thereby decreasing skew and increasing reliability of the coating film. A deep-portion initiator may include an acetophenone-based compound such as 2,2-dimethoxy-2-phenylacetophenone, 4'-ethoxyacetophenone, 3'-hydroxyacetophenone, 4'-phenoxyacetophenone, and the like may be included as an example. These may be used alone, respectively, or in combination.

The amount of the photopolymerization initiator may be about 1 wt % to about 5 wt %, of the total weight of the photoresist composition. If the content of the photopolymerization initiator is less than about 1 wt % of the total weight of the photoresist composition, then a photoreaction of the photoresist composition may not occur sufficiently enough. On the contrary, if the content of the photopolymerization initiator is more than about 5 wt % of the total weight of the photoresist composition, then the photoreaction rate of the photoresist composition may be out of control.

D. Black Coloring Agent

The photoresist composition includes a black coloring agent so that the photoresist patterns formed from the photoresist composition may serve as a black matrix.

As an example of the black coloring agent according to an exemplary embodiment includes carbon black, titanium black, acetylene black, aniline black, perylene black, strontium titanate, chromium oxide, ceria, or the like. These exemplary black coloring agents may be used alone, or in combination. In an embodiment, the particle size of the black coloring agent may be 60 to 120 nm.

In another exemplary embodiment, the black coloring agent may include a black pigment such as Bk9599 (Tokushiki, Japan), or a black dye.

If the amount of the black coloring agent is less than about 5 wt % of the total weight of the photoresist composition, then the absorbance (optical density) of the coating film may be lowered, and thus, have an insufficient shading property. Furthermore, if the amount of the black coloring agent is more than about 10 wt % of the photoresist composition, then photoresist composition may interrupt the curing process. Therefore, it is preferred that the amount of the black coloring agent is about 5 wt % to about 10 wt % of the total weight of the photoresist composition.

E. Solvent

A solvent is employed to disperse a binder resin, a photopolymerization monomer, a photopolymerization initiator, and a black coloring agent with a dispersant to make the photoresist composition in a coatable solution state.

An example of the solvent includes propylene glycol monomethylether acetate, ethylethoxypropionate, cyclohexanone, dipropylene glycol monomethylether acetate, n-butylacetate, isobutylacetate, ethyleneglycol monomethylacetate, ethyleneglycol n-butylacetate, diethyleneglycol dimethylether, dipropylene glycol monomethylacetate, diethyleneglycol methylether, dipropylene glycol n-butylether, tripropylene glycol n-butylether, tripropylene glycol methylether, propylene glycol methylether acetate, propylene glycol diacetate, 3-ethoxy Prionate acid methyl, methanol, ethanol, methylcellusolve monomethylether, ethylcellusolve acetate, diethyleneglycol monomethylether, methylethyl ketone, butyl acetate sellusolve, 4-hydroxy-4-methyl-2-pentanone, ethyl(2-hydroxy-2-methylethylprionate, or the like. These exemplary solvents may be used alone, respectively, or in combination of two or more.

The photoresist composition may include a residual amount of solvent excluding a binder resin, a photopolymerization monomer, a photopolymerization initiator, and a black coloring agent. For example, the photoresist composition may include about 65 wt % to about 84 wt % solvent. The content of the solvent may be reduced, depending on the content of additional components.

F. Dispersant

A dispersant covers the surface of the black coloring agent particles to suppress aggregation between the black coloring agent.

Example dispersants include BYK-200 (BYK-chemie, Germany), BYK-2001, BYK-161, BYK-163, BYK-160, BYK-161, PD-7000 (CRODA, Germany), DFKA-4330 (BASF, Germany), Disper-650 (Evonik, Germany), or the like. These exemplary dispersants may be used alone or in combination of two or more.

If the amount of the dispersant is more than about 1 wt % of the total weight of the photoresist composition, then the dispersant may interrupt coloration of a pigment in the photoresist composition, thereby deteriorating absorbance. Therefore, it is preferred that the amount of the dispersant is about 1 wt % or less of the total weight of the photoresist composition.

G. Sensitizer

A sensitizer may lower activation energy in the generation of radicals by the photopolymerization initiator. For example, the sensitizer may increase the absorbance of the photoresist composition, thereby reducing the amount content of the photopolymerization initiator needed.

Further, the use of a sensitizer in the photoresist composition may enable the use of diversified photopolymerization monomers and solvents. This may allow for fine tuning of a photo margin of the photoresist composition, thereby reducing production costs.

Examples of the sensitizers include diethylenethioxanthone (DETX), violanthrone, isoviollanthrone, fluoresceine, rubrene, 9,10-diphenylanthracene, tetracene,13,13'-Dibenzantronile, and the like. These exemplary sensitizers may be used alone or in combination of two or more.

The amount of the sensitizer may be about 1 wt % to about 2 wt % of the total weight of the photoresist composition. If the amount of the sensitizer is less than about 1 wt % of the total photoresist composition, then it is difficult to improve a photo margin. If the amount of the sensitizer is more than 2 wt % of the photoresist composition, then solubility of the photoresist composition may be lowered.

H. Wavelength Shifter

A wavelength shifter may improve sensitivity to light in an h-line wavelength range of the photoresist composition by assisting the photopolymerization initiator and the sensitizer.

Examples of the wavelength shifter may include N-(2-phenyl-1,3-benzoxazol-5-yl)naphthalene-1-carboxamide, 7-(diethylamino)-4-(trifluoromethyl)-2H-chromene-2-one, or the like. These exemplary wavelength shifters may be used alone, respectively, or in combination of two or more.

The amount of the wavelength shifter may be identical to the weight of the photopolymerization initiator in the photoresist composition. If the amount of the wavelength shifter is identical to the weight of the photopolymerization initiator in the photoresist composition, then the photoresist composition exhibits an excellent high adhesion effect.

I. Additive

The photoresist composition may further include an additive such as a surfactant, an adhesion enhancer, and the like. The additive may be included in an amount of about 1 wt % or less of the total weight of the photoresist composition. If the amount of the additive is more than about 1 wt % of the total weight of the photoresist composition, then the characteristic of the coating film may be deteriorated.

A surfactant may reduce interfacial tension between a coating film and a substrate, forming a uniform coating film on a lower layer or a substrate, and promoting sufficient dissolution between each photoresist composition. Examples of suitable surfactants include FZ-2110 (Dow Corning, U.S.A.), FZ-2122, BYK-345 (BYK, U.S.A.), BYK-346, BYK-34, or the like. These may be used alone or in combination of two or more.

If a substrate is a glass substrate formed of an inorganic material, an adhesion enhancer may improve the adhesion strength between the photoresist composition of an organic material and the glass substrate. The adhesion enhancer which is a material having a organic functional group and an inorganic functional group. The adhesion enhancer may include a silane coupling agent, melamine crosslinking agent, or the like.

Examples of silane coupling agents include KBM-303 (shitetsu, Japan), KBM-403, KBE-402, KBE-40, or the like. Example of melamine crosslinking agents include MW-30M (Visiontech, Korea), MX-706 (Visiontech, Korea) or the like.

According to the above description, the photoresist composition may include a photopolymerization initiator activated by light from a digital exposure apparatus having a wavelength of about 400 nm to about 410 nm in a h-line wavelength range, thereby improving a light characteristic.

Further, the photoresist composition may include an oxime ester-based strong photoinitiator, thereby forming fine patterns of 4 μm or less, and use a surficial-portion initiator and a deep-portion initiator together, thereby improving adhesion strength and reliability of the photoresist patterns.

Additionally, the photoresist composition may include a cardo-based resin together with an acryl-based resin, thereby forming photoresist patterns having a taper angle suitable for a black matrix.

The photoresist composition according to an exemplary embodiment may be suitable to form a black matrix, however, also be used to form a fine shading film of various electronic devices.

In another exemplary embodiment, a black matrix including the photoresist resin composition is provided. Hereinafter, embodiments will be described with reference to accompanying drawings.

FIGS. 1 through 5 are cross-sectional views for describing a method of manufacturing a black matrix and a display substrate according to an exemplary embodiment.

Referring to FIG. 1, the photoresist composition prepared according to an exemplary embodiment as described above is coated on a base substrate 10 to form a coating film 20. The base substrate 10 may be a glass substrate, a soda lime substrate, a plastic substrate, and the like. Depending on the purpose, those exemplary substrates may be pretreated by chemicals (e.g., a silane coupling agent), plasma, ion plating, a gas phase reaction, sputtering, or vacuum deposition.

The coating film 20 may be formed using dip coating (dipping), spin coating, roller coating, spray coating, bar coating, slit coating, and the like. In order to partially remove a solvent before exposing the coating film 20, the coating film 20 may undergo pre-baking so that a relatively rigid coating film 20 is formed on a base substrate 10. Solid components of the pre-baked coating film 20 are not pyrolyzed, but most of the solvent may be evaporated to minimize the concentration of the solvent.

Figure 2:
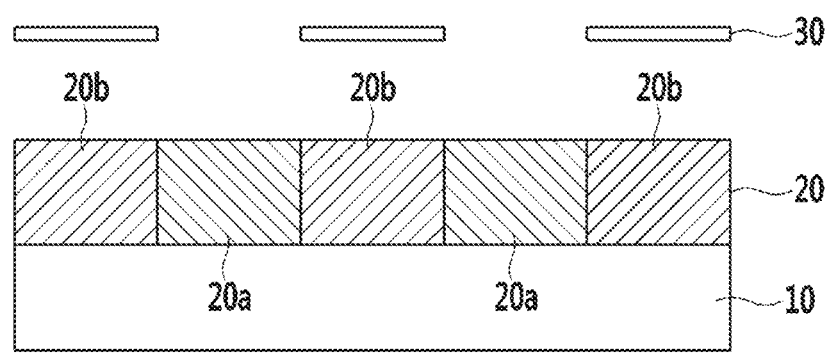

In FIG. 2, after forming the coating film 20 on the base substrate 10, the coating film 20 is exposed by using light in an h-line wavelength range. Specifically, light at about 400 nm to 410 nm may be emitted. More specifically, light at 405 nm may be emitted. In an exemplary embodiment, in order to carry out the exposure process, an exposure mask 30 may be interposed on the coating film 20.

In another exemplary embodiment, the coating film 20 may be exposed using a digital exposure apparatus with a light source emitting light in a h-line wavelength range, but without a separate shading mask. The digital exposure apparatus may selectively determine the region on which light is provided and the region on which light is not provided.

Accordingly, the coating film 20 stacked on the base substrate 10 may be divided into an exposure region 20a irradiated with light and a shaded region 20b not irradiated with light.

Figure 3:
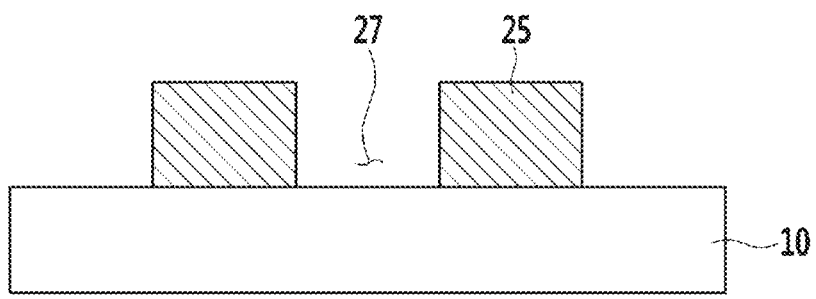

Referring to FIGS. 2 and 3, the portion of the coating film 20 in the shaded region 20b (the portion on which light is not provided) is removed, thereby forming a black matrix 25.

Specifically, when a developing agent such as an alkali solution is provided on a coating film 20, the coating film 20 in the exposure region 20a in FIG. 2 does not dissolve. However, the coating film 20 in the shaded region 20b does dissolve and thus removed from the base substrate 10. Because the coating film 20 in the exposure region 20a does not dissolve in the alkali solution it remains to form a black matrix 15. In order to provide a developing agent such as an alkali solution on the coating film 20, a dipping method, a spray method, or the like may be used.

After removing the coating film 20 in the shaded region 20b, a black matrix 25 may undergo a post-baking process in order to increase adhesion and the like.

A black matrix 25 includes a first stripe pattern extended in a first direction of the base substrate 10, and a second stripe pattern extended in a second direction intersecting the first direction, and thus defining a plurality of openings 27 disposed in the black matrix 25.

Figure 4:
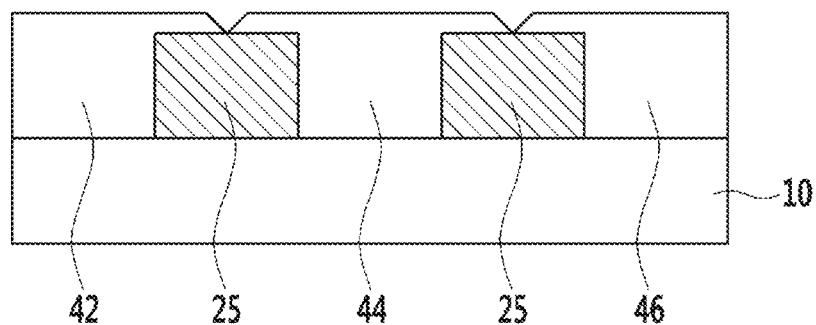

Referring to FIG. 4, color filters 42, 44, and 46 are formed on the same base substrate 10 as that of the black matrix 25.

The color filters 42, 44, and 46 may fill openings defined by the black matrix 25, and overlap a portion of the black matrix 25.

The color filters 42, 44, and 46 may include a plurality of color filters having different colors from each other. For example, a first color filter 42 may represent red, a second color filter 44 may represent green, and a third color filter 46 may represent blue. The first color filter 42, the second color filter 44, and the third color filter 46 may be formed from different photoresist compositions from each other.

For example, a first photoresist composition including a red pigment is coated on the base substrate 10, then exposure and development processes are carried out to form a first color filter 42, and a second photoresist composition including a green pigment is coated on the base substrate 10, then exposure and development processes are carried out to form a second color filter 44, and a third photoresist composition including a blue pigment is coated on the base substrate 10, then exposure and development processes are carried out to form a third color filter 46. The first color filter 42, the second color filter 44, and the third color filter 46 may partially overlap each other.

The first color filter 42, the second color filter 44, and the third color filter 46 may be formed using the existing exposure apparatus, or using a digital exposure apparatus.

Figure 5:
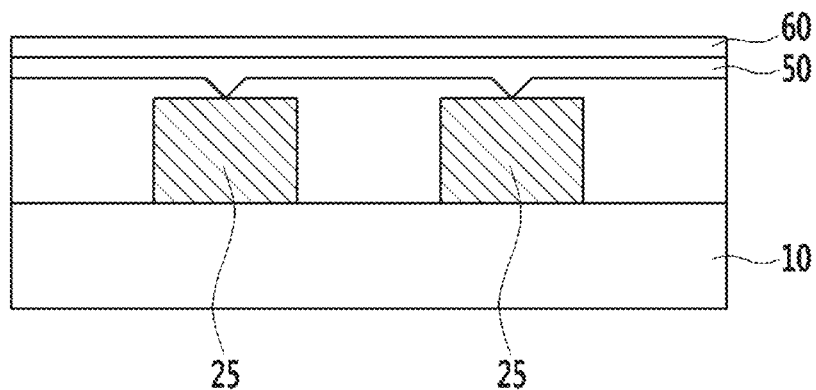
Figure 6:
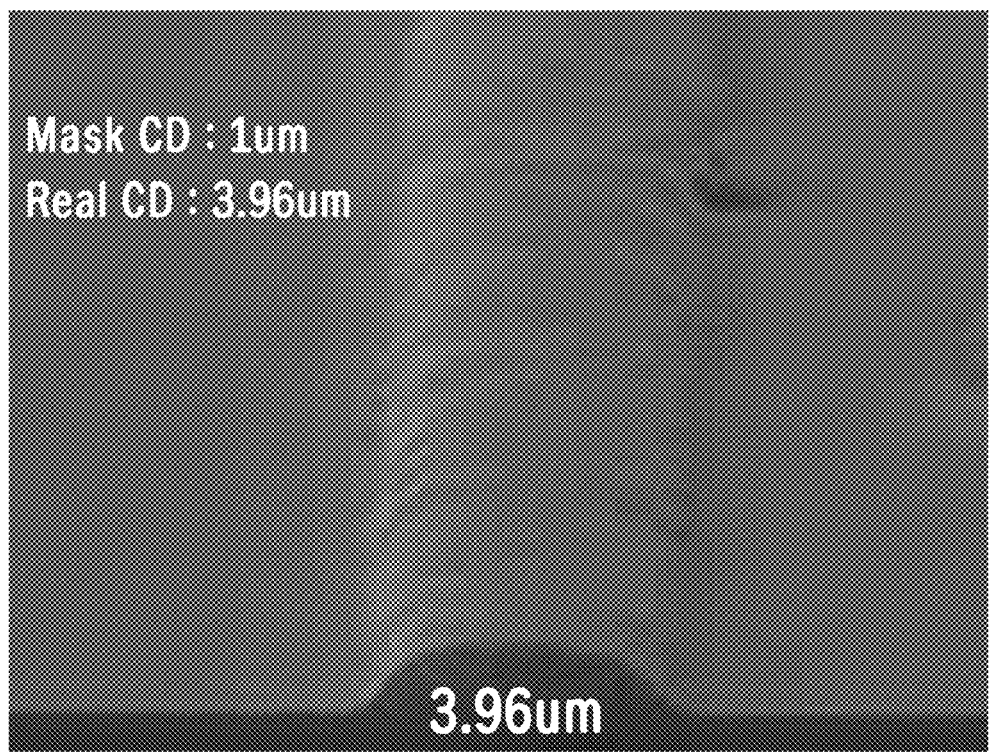
FIG. 6 is a SEM photograph representing a black matrix pattern according to an exemplary embodiment.

Referring to FIGS. 5 and 6, a planarization film 50 and a transparent electrode 60 are formed on color filters 42, 44, and 46. A planarization film 50 serves to planarize a step height generated by the color filter. A transparent electrode 60 is formed on the planarization film 50 and may function as a common electrode in a display panel.

For example, the planarization film 50 may be an organic insulator including an acryl resin, a phenol resin, polyimide resin or the like. The transparent electrode 60 may include indium tin oxide (ITO) or indium zinc oxide (IZO).

Figure 7:
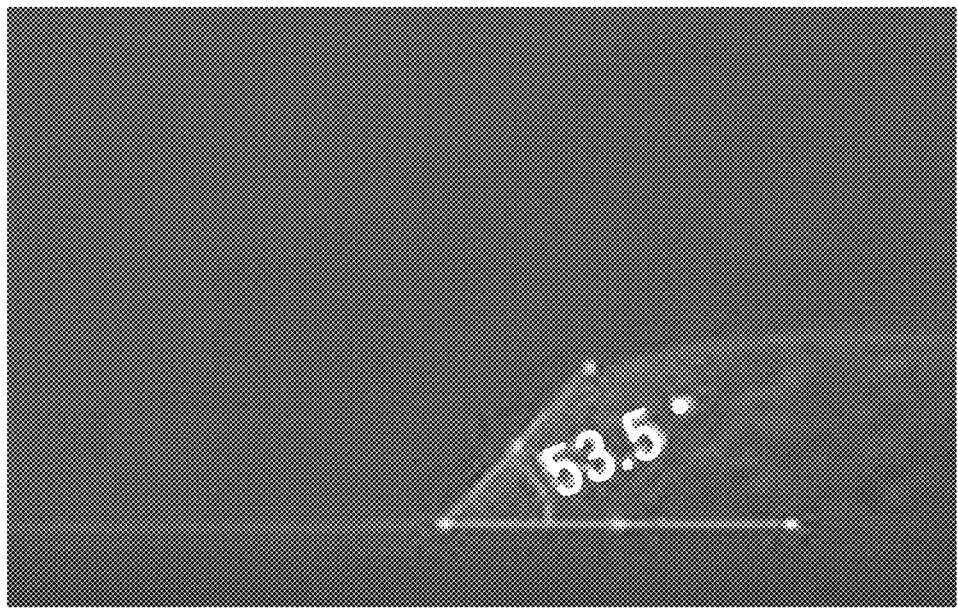
FIG. 7 is a SEM photograph representing a vertical section of a black matrix pattern according to an exemplary embodiment.

A scanning electron microscope (SEM) measurement was carried out in order to review the pattern of the black matrix including the photoresist composition manufactured in an exemplary embodiment of the present invention. Measurement results are shown in FIGS. 6 and 7. FIG. 6 is a SEM photograph of a pattern shape in an edge portion of the substrate among black matrix patterns using the photoresist composition according to an exemplary embodiment. FIG. 7 is a SEM photograph of a vertical section of black matrix patterns using the photoresist composition according to an exemplary embodiment.

Referring to FIGS. 6 and 7, black matrix patterns formed using the photoresist composition according to an exemplary embodiment have a line width of 3.96 μm with fine patterns formed, and represent a taper angle of 53.5°.

As described above, high resolution and high quality images may be realized by implementing fine patterns of 4 μm or less.

It will be apparent to those skilled in the art that various modifications and variations can be made in the present invention without departing from the spirit or scope of the invention provided they come within the scope of the appended claims and their equivalents.

What is claimed is:

1. A photoresist composition, comprising:
5 wt % to 10 wt % of a binder resin;
5 wt % to 10 wt % of a photopolymerization monomer;
1 wt % to 5 wt % of a photopolymerization initiator comprising an oxime ester-based compound and activated by light in a wavelength range of 400 nm to 410 nm;
5 wt % to 10 wt % of a black coloring agent; and
a residual amount of a solvent,
wherein the binder resin comprises an acryl-based resin and a cardo-based resin, and
wherein a weight ratio between the acryl-based resin and the cardo-based resin is no more than 9:1 and greater than 8:2.

2. The photoresist composition of claim 1, wherein:
the oxime ester-based compound comprises at least one of:
[1-(4-phenylsulfanylbenzoyl)hepthylideneamino]benzoate and [1-[9-ethyl-6-(2-methylbenzoyl)carbazol-3-yl]ethylideneamino]acetate.

3. The photoresist composition of claim 1, wherein:
the photopolymerization initiator is a surficial-portion initiator, and further comprises at least one of:
a bisacylphosphine-based compound, a monoacylphosphine-based compound, a metallocene-based compound, and an alpha-hydroxyketone-based compound.

4. The photoresist composition of claim 3, wherein:
the photopolymerization initiator comprises at least one of:
phenyl bis(2,4,6-trimethylbenzoyl)phosphine oxide, diphenyl (2,4,6-trimethylbenzoyl)phosphine oxide, phenyl bis(2,4,6-trimethylbenzoyl)phosphine oxide, and bis(eta5-2,4-cyclopentadiene-1-yl) bis[2,6-difluoro-3-(1H-pyrrol-1-yl)phenyl)titanium, and 4-(dimethylamino)benzophenone.

5. The photoresist composition of claim 1, wherein:
the photopolymerization initiator is a deep-portion initiator and further comprises an acetophenone-based compound, and
the acetephenon-based compound comprises at least one of:
2,2-dimethoxy-2-phenylacetophenone, 4'-ethoxyacetophenone, 3'-hydroxyacetophenone, 3-hydroxyacetophenone, and 4'-phenoxyacetophenone.

6. The photoresist composition of claim 1, wherein
the acryl resin:
has a weight average molecular weight of 3,000 to 50,000; and
comprises at least one of: methacrylic acid, acrylic acid, crotonic acid, maleic acid, vinyl pyrrolidone, styrene, methyl methacrylate, benzyl metacrylate, 2-hydroxyethylmethacrylate, aryl methacrylate, and glycidyl methacrylate; and
the cardo-based resin has:
a weight average molecular weight of 3,000 to 10,000; and
comprises at least one of: 9,9-bis(4-hydroxylphenyl)fluorene, epichlorohydrin, and acrylic acid.

7. The photoresist composition of claim 1, wherein:
the photopolymerization monomer comprises a polyfunctional monomer and a monofunctional monomer.

8. The photoresist composition of claim 7, wherein:
the polyfunctional monomer comprises at least one of:
dipentaerythritol hexaacrylate, pentaerythritol triacrylate, pentaerythritol tetraacrylate, trimethylpropane triacrylate, trimethylpropane trimethacrylate, glycerol triacrylate, tris(2-hydroxyethyl)isocyanurate triacrylate, di-trimethyl propane tetraacrylate, dipentaerythritol pentaacrylate, and pentaerythritol tetraacrylate.

9. The photoresist composition of claim 7, wherein:
the monofunctional monomer comprises at least one of:
glycidyl methacrylate, hydroxyethyl methacrylate, 2-hydroxy 3-phenoxypropyl acrylate, diethylene glycol methyl ether methacrylate, hydroxyethyl acrylate, butyl methacrylate, hydroxypropyl acrylate, 2-phenoxyethyl acrylate, 2-phenoxyethyl methacrylate, 3,3,5-trimethylcyclohexyl methacrylate, isobornyl acrylate, isobornyl methacrylate, isodecyl acrylate, isodecyl methacrylate, isooctyl acrylate, lauryl acrylate, stearyl acrylate, tetrahydrofurfuryl acrylate, and tridecyl acrylate.

10. The photoresist composition of claim 7, wherein:
a weight ratio between the polyfunctional monomer and the monofunctional monomer is 1:9 to 3:7.

11. The photoresist composition of claim 1, further comprising:
1 wt % to 2 wt % of a sensitizer,
wherein the sensitizer comprises at least one of: diethylenethioxanthone, violanthrone, isoviolanthrone, fluorescein, rubrene, 9,10-diphenylanthracene, tetracene, and 13,13'-dibenzanthronile.

12. The photoresist composition of claim 1, further comprising:
a wavelength shifter of the same weight as the photopolymerization initiator,
wherein the wavelength shifter comprises at least one of: N-(2-phenyl-1,3-benzoxazol-5-yl)naphthalene-1-carboxamide and 7-(diethylamino)-4-(trifluoromethyl)-2H-chromene-2-one.

13. The photoresist composition of claim 1, wherein:
the black coloring agent comprises at least one of: carbon black, titanium black, acetylene black, aniline black, perylene black, strontium titanate, chromium oxide, and ceria.

14. The photoresist composition of claim 1, further comprising:
1 wt % or less of a dispersant.

15. The photoresist composition of claim 1, further comprising:
1 wt % or less of an additive, wherein the additive comprises at least one of: a surfactant and an adhesion enhancer.

16. The photoresist composition of claim 1, wherein:
the solvent comprises at least one of: propylene glycol monomethyl etheracetate, ethyl ethoxy propionate, cyclohexanone, dipropylene glycol monomethyl etheracetate, n-butylacetate, isobutyl acetate, ethylene glycol monomethyl acetate, ethylene glycol n-butyl acetate, diethylene glycol dimethyl ether, dipropylene glycol monomethyl acetate, diethylene glycol methyl ether, dipropylene glycol n-butyl ether, tripropylene glycol n-butyl ether, tripropylene glycol methyl ether, propylene glycol methyl ether acetate, propylene glycol diacetate, cyclohexanone, 3-ethoxy prionic acid methyl, methanol, ethanol, methyl cellusolve monomethyl ether, ethyl cellusolve acetate, diethylene glycol monomethyl ether, methylethyl ketone, 4-hydroxyl 4-methyl2-pentanone, 2-hydroxy 2-methylpropionic acid ethyl, and butyl acetate cellusolve.

17. A method of manufacturing a black matrix, comprising:
applying a photoresist composition on a base substrate to form a coating film, the photoresist composition comprising:
  5 wt % to 10 wt % of a binder resin, 5 wt % to 10 wt % of a photopolymerization monomer;
  1 wt % to 5 wt % of a photopolymerization initiator comprising an oxime ester-based compound and activated by light in a range of a wave length of 400 nm to 410 nm;
  5 wt % to 10 wt % of a black coloring agent;
  1 wt % or less of an additive; and
  a residual amount of a solvent;
exposing the coating film to form a photopolymer; and
developing the coating film to form a photoresist pattern,
wherein the binder resin comprises an acryl-based resin and a cardo-based resin, and
wherein a weight ratio between the acryl-based resin and the cardo-based resin is no more than 9:1 and greater than 8:2.

18. The method of claim 17, wherein:
the photoresist pattern is a fine pattern of 4 μm or less.

\* \* \* \* \*